United States Patent

Guérin et al.

[11] Patent Number: 6,057,891
[45] Date of Patent: May 2, 2000

[54] METHOD AND APPARATUS FOR CALIBRATING AN ANALOG TO DIGITAL CONVERTER

[75] Inventors: Jean-Claude Guérin, Saint-Pierre de Plesguen; Philippe Morel, Rennes, both of France

[73] Assignee: Thomson Licensing S.A., Boulogne Cedex, France

[21] Appl. No.: 08/955,979

[22] Filed: Oct. 22, 1997

[30] Foreign Application Priority Data

Oct. 25, 1996 [FR] France ................................. 96 13026

[51] Int. Cl.[7] ............................ H04N 5/14; H03M 1/12; H03M 1/06
[52] U.S. Cl. ........................... 348/572; 348/571; 348/572; 348/573; 341/118; 341/120; 341/138; 341/155
[58] Field of Search ..................... 348/571, 572, 348/573; 341/155, 156, 157, 158, 159, 160, 161–172, 118, 120, 138

[56] References Cited

U.S. PATENT DOCUMENTS

| | | |
|---|---|---|
| 4,947,168 | 8/1990 | Myers ........................................ 341/120 |
| 5,047,772 | 9/1991 | Ribner ....................................... 341/156 |
| 5,121,119 | 6/1992 | Higuchi et al. ........................... 341/120 |
| 5,184,127 | 2/1993 | Myers ....................................... 341/122 |
| 5,389,929 | 2/1995 | Nayebi et al. ............................ 341/156 |
| 5,500,644 | 3/1996 | Denjean et al. .......................... 341/120 |
| 5,598,157 | 1/1997 | Kornblum et al. ....................... 341/120 |

FOREIGN PATENT DOCUMENTS

WO 8911757 11/1989 WIPO .

Primary Examiner—John K. Peng
Assistant Examiner—Paulos Natnael
Attorney, Agent, or Firm—Joseph S. Tripoli; Eric P. Herrmann; Ronald H. Kurdyla

[57] ABSTRACT

A process for correcting the input-output correspondence of an analog-to-digital converter includes calculating the equation of the actual input-output correspondence, for known input values, during programmed conversion suspension periods. A comparison with the ideal conversion line subsequently makes it possible to calculate the necessary offset and gain corrections. The process is applied to the digital conversion of a plurality of component video signals.

19 Claims, 5 Drawing Sheets

SAMPLING OF Y
BEFORE PHASING

FIG. 4a

SAMPLING OF Y
AFTER PHASING

FORM OF THE TEST SIGNAL

METHOD AND APPARATUS FOR CALIBRATING AN ANALOG TO DIGITAL CONVERTER

The invention lies in the field of processes for correcting analog/digital converters. It also relates to a device operating according to the process.

BACKGROUND OF THE INVENTION

It is known that an analog/digital converter converts an input quantity X into an output quantity Y. The transfer function of an analog/digital converter is, having regard to the quantization, a non-linear function of the input value. The output value varies quantum-wise. A quantum is the difference in output value between two numerically consecutive values.

Figure 1:
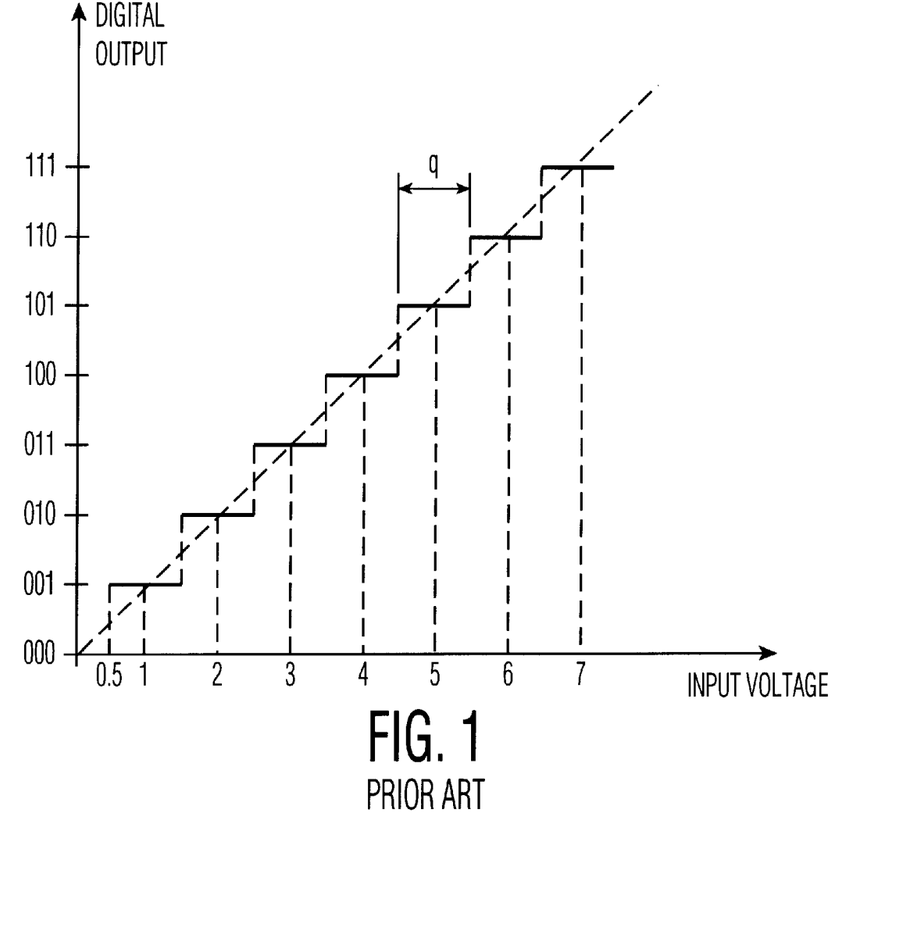
FIG. 1 already described is a curve intended to explain the principle of digital conversion.

Ideally, all the quanta are equal and ideally, the mean value of a quantization plateau is deduced from the input value through a linear function of the form Y=AX. Such an ideal transfer function is represented in FIG. 1. This figure lies in the input/output plane and represents the output value along the ordinate versus the input value plotted along the abscissa. The output includes, in this example of FIG. 1, eight levels from 0 to 7 in integer values or expressed in binary base mode from 000 to 111. The output value retains the same value when the input varies between two consecutive values representing the quantization spacing q. A straight line D represented by dashes joins the mid-points of each of the plateaux.

It is also known that through its very principle, such an ideal converter systematically introduces some errors termed the quantization error. Statistically, this error has an equal probability of taking absolute values lying between $-q/2$ and $+q/2$.

The slope of the line joining the middles of the segments representing the output value as a function of the input value is termed the gain line. Actual converters are, however, subject to drifting which, on the one hand, causes the gain of the converter to vary and, on the other hand, gives rise to an offset in the value of the zero of the converter. The errors thus incurred are referred to as the gain error and offset error.

Figure 2:
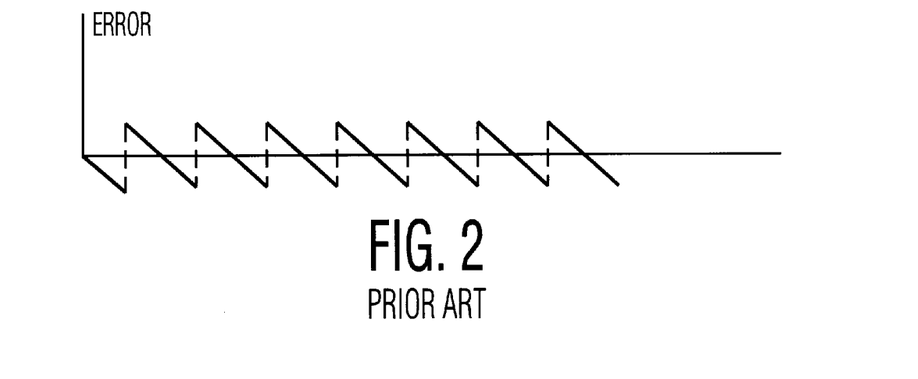
FIG. 2 already described is a curve intended to explain the sytemmatic error resulting form digital conversion.

The value of the systematic error of the ideal converter as a function of the input value is represented in FIG. 2. This error is alternately positive and negative and varies in jumps. For this reason, closed-loop feedback for bringing the offset error and the gain error to 0 is not undertaken in practice.

This type of error being known, a remedy therefor has however been attempted.

Thus, the U.S. Pat. No. 4,947,168 MYERS describes an analog/digital converter in which two types of corrections are performed, these two types of corrections being performed in open loop. On the one hand, a correction is performed by adding a correction value, stored in a memory 49, to the output value by means of an adder 29. The correction value is stored at an address of the memory which depends on an output value given by a first part of the converter converting the most significant bits (MSB). Total conversion results from the addition of the most significant bits obtained at the output of a converter 17, of the least significant bits (LSB) obtained at the output of a low-significance converter 27 and of the correction value originating from the memory 49. The values originating from the memory 49 are periodically renewed during the idle conversion times.

As explained (column 7, line 39 and column 8, line 51), a calibration sequence includes an initialization step and a calibration step. The calibration step consists in generating known values by means of a slow but accurate reference digital analog converter 43. The difference between the actual value given by the reference converter 43 and the value measured at the output of the low-significance converter 27 is stored in the memory 49 at the address indicated by the high-significance converter 17.

The initialization step consists in setting the gain and offset values of a fast but inaccurate digital/analog converter 21 used to subtract from the analog input value the value converted on the most significant bits by the high-significance converter 17. This step also makes it possible to adjust the offset error of the low-significance converter 27.

As explained in column 8, lines 46–51, the calibration step consisting in replacing the values stored in the memory 49 can be repeated periodically during the system idle times whereas the initialization step is in principle performed only at the beginning of a conversion period.

It is moreover, known to those skilled in the art to carry out adjustments to the offset value and to the value of the gain through open-loop monitoring which makes it possible to calculate errors and adjust them, manually or according to automated sequences.

As explained above, the subject of the present invention is an analog/digital converter (ADC) in which the correction of gain and of offset is performed in closed loop during the idle conversion times. As compared with the prior art such as results from the MYERS patent, the invention has the advantage of using a smaller number of memories. It also has the advantage of closed-loop regulation, on open-loop systems. This is intended to mean that after a time of operation, the residual errors, here in gain and offset, are near-0 errors and result from outside disturbances alone, due, for example, to the ageing of the components or to temperature deviations. The invention is particularly advantageous in cases where several analog quantities are firstly treated according to predetermined processes so as, for example, to reduce the dynamic range of quantities which are to be input to the converters. Such a case arises, for example, in television video signal acquisition cards in which analog voltage values representing the values of red, green and blue are transformed in a known manner and are defined by standards as luminance Y and red DR and blue DB difference signals. The signals Y, DR and DB make it possible to reconstruct, in a known manner, grey levels for a black and white image or red, green and blue signals so as to construct, in a known manner, a colour image. In such a case, the accuracy of the closed-loop correction makes it possible to guarantee good accuracy of the gain adjustments for an analog matrix for transforming analog quantities, even in the case of small matrix coefficients such as those encountered in matrices for converting to colour space. Moreover, in the case of television video signals, there are no signals to be converted on the one hand between each line and on the other hand between each frame. These periods in which there are no signals to be converted, termed blanking periods, are therefore regularly present during the conversion of video signals.

SUMMARY OF THE INVENTION

According to the invention, action is taken to correct the value of the offset and the value of the gain in the analog input quantity in such a way that the analog/digital conversion performed on the values thus corrected corresponds to conversion on the actual values present at the input, according to a conversion line $Y=a_0X+b_0$, this being the desired conversion line. As indicated at the beginning of this description and recalled below more precisely, in a known manner the converter transforms a continuous input value X varying over a range of values lying between two extreme values $X_0$ and $X_{n-1}$. The transform Y takes, when X varies from $X_0$ to $X_{n-1}$, n values, a value $Y_0$ when X has the value $X_0$, $Y_{n-1}$ when X has the value $X_{1-1}$ and n−2 intermediate values $Y_1, Y_2 \ldots, Y_{n-2}$ resulting from the quantity X, on the one hand through a linear transformation ideally according to the ideal conversion line whereby Y is given a value such that $$Y = \frac{Y_{n-1} - Y_0}{X_{n-1} X_0} X + Y_0$$

and on the other hand through a quantization whereby the quantity Y is given a constant output value when X varies from a value $X_{p-1}$ to a value $X_p$ (1<p<n−1). The intervals $X_p - X_{p-1}$ are equal to $$\frac{X_{n-1} - X_0}{n-1}$$

The constant values are the values obtained for Y through linear transformation when X takes the median value of each interval. According to the correction process specific to the invention, the algebraic offset is calculated, for an input value $X_{q0}$, between the actual value $Y_{q0}$ obtained by the fed-back device and a theoretical value $Y_{q'0}$ which would have been obtained if the device had converted according to the transfer function theoretically expected thereof. The input values X are subsequently corrected by adding the algebraic value of offset to these input values. This first correction corrects the offset.

The actual values $Y_{m1}, \ldots, Y_{mm}$ obtained at the output of the fed-back device are measured, for known input values m $X_1, \ldots, X_m$ corrected by the previously calculated algebraic offset.

The slope $a_1$ is determined of a straight line passing near the m points $M_1, M_2, \ldots, M_m$ with co-ordinates $X_1 Y_{m1}, \ldots, X_m Y_m$. It is supposed that a straight line passes near M points, for example when the sum of the squares of the distances from each point to the line is a minimum. At this juncture, it may be supposed that any known mathematical method for estimating whether the position of a line is the nearest of the lines which can be made to pass through the m points is sufficient to estimate nearness.

The input value is corrected by applying to the input quantity X a coefficient equal to the ratio between the value $a_0$ of the slope of the theoretical conversion line and the slope $a_1$ of the line near the m points.

It is realized from this description that the method according to the invention allows a correction of the offset only by a value corresponding to an integer number of converter quantization quanta. Similarly, for the gain correction, it is noted that the ordinates of the points $M_1, M_2, \ldots, M_m$ can only take values corresponding to quantization plateaux of the device. This results in some coarseness of the corrections thus performed. This is why, in order considerably to improve the results obtained by the invention and according to an important variant thereof, the output value $Y_p$ associated with each of the input values $X_p$ is an average between s values $Y_{r1}, Y_{r2}, \ldots, Y_{rs}$. These s values are obtained by varying the input quantity X, about a value $X_{m0}$. The values $X_{r1}, X_{r2}, \ldots, X_{rs}$ allocated to the quantity X will have the property of being symmetric with respect to $X_{m0}$. Symmetry is intended to mean, on the one hand, that the average of the values $X_{r1}$ to $X_{rs}$ to which the output values $Y_{r1}, Y_{r2}, \ldots, Y_{rs}$ correspond, is equal to $X_{m0}$ on the one hand, and on the other hand, that the values $X_{r1}$ to $X_{rs}$ exhibit a symmetry with respect to $X_{m0}$. The discrepancy between the minimum value taken by X: $X_{rmin}$ and the maximum value taken by X: $X_{rmax}$ will be several quanta. To summarize, the invention relates to a process for correcting the value of an input quantity X of an analog/digital converter delivering a digital output quantity Y dependent on the value of the quantity X, the output value Y ideally taking n values $Y_0, \ldots, Y_{n-1}$ regularly spaced by a spacing ΔY when X varies from a value $X_0$ to a value $X_{n-1}$, Y ideally taking the value $Y_0$ when X has, to within a spacing, the value $X_0$, the value $Y_{n-1}$ when X has, to within a spacing, the value $X_{n-1}$ and n−2 intermediate values $Y_1, Y_2, \ldots, Y_{n-2}$ resulting from the quantity X, on the one hand through a linear transformation of the form $y = a_0 X + b_0$, and on the other hand, through a quantization Y, Y retaining the same output value $Y_p$ when X varies from a value $X_{p-1}$ to a value $X_p$, the value $Y_p$ being one of the values obtained from the linear transformation when X varies between $X_{p-1}$ and $X_p$, in which process the corrections are performed during conversion by harnessing conversion suspension periods interposed between periods of conversion, so as to inject known values of the input quantity X into the converter and deduce therefrom correction values to be applied, the process being characterized in that during one or more conversion suspension periods and in a continual iterative manner throughout conversion, a) for an integer number m of input values $X_{m1}, \ldots, X_{mm}$, the output values $Y_{m1}, \ldots, Y_{mm}$ obtained are measured, b) the equation $Y = a_1 X + b_1$ of the actual conversion line resulting from these m measurements is calculated, this line being the nearest to the m points with co-ordinates $X_{m1}, Y_{m1}; X_{m2}, Y_{m2}; \ldots; X_{mm}, Y_{mm}$, c) the offset error is corrected by adding the algebraic value of the difference b between $b_1$ and $b_0$ to the analog input quantity, d) the gain of the conversion is corrected by multiplying the input quantity X by the latest ratio $a_1/a_0$ calculated.

As explained above, in a preferred embodiment, each of the output values Ym results from averaging s input values, for example for an input value $X_{mt}$ (1<t≤m), $X_{mt1}$ to $X_{mts}$. The s values $X_{mt}$ are symmetric with respect to a central value $X_m$. The discrepancy between $X_{mtmin}$, the minimum $X_{mt}$ value, and the maximum input value $X_{mtmax}$, is a few spacings, the spacing Δx having the value $$\frac{X_{n-1} - X_0}{n}.$$

In the case in which the process according to the invention is applied to a converter mounted on a multicomponent video signal acquisition card, for example a signal with a red component R, a green component G and a blue component B or else a total luminance component Y and two colour difference signals DR and DB, the phases of the three components have to be synchronized in a known manner. It was seen that according to the invention, during the periods of suspension of conversion, the m actual values $Y_m$ obtained at the output of the converter are measured for m known input values $X_{m1}, \ldots, X_{mm}$. The m input values are generated, for example, by a test-pattern generator which will display, for example, increasing values varying by successive plateaux. When adjusting the phase, the values when they have stabilized on a plateau will be of no interest since, for these stabilized values, the output value has also stabilized and any phase shifts can no longer be observed.

By contrast, when there are abrupt jumps from one input value to the next, the circuit filters and elements located between the test-pattern generator and the converter transform the, for example, rising edge between two successive values generated by the test-pattern generator, into a less steep rising edge. It is this less steep rising edge which will be used to phase the capturing of samples by each of the converters stationed on each of the paths. When the capturing of samples is said to be phased, this is not intended to mean that the three samples, for example that of the luminance path and those of the two chrominance paths, are captured simultaneously. On the contrary, the capturing of samples will in general be offset over time. This means that the samples will be captured at one and the same time of the composite video signal. If a first component travels around a first path more quickly than a second component around a second path, then the sample capture will be delayed on the second path by the difference between the time taken by the second component to go from the input of the conversion means to the converter and the time taken by the first component to perform this same journey.

A first step of the process will consist therefore in adjusting the sampling phase of one of the paths so that a sampling instant of this path always corresponds with a known point of the rising edge, for example the middle value between two stabilized values. Subsequently, the instant of sample capture of the other two paths will be aligned so that it coincides with the same known point of their respective rising edges, for example the middle value between two stabilized values. To make the sampling delay accurate, it will include, on the one hand, a digital delay line which shifts the phasing of sample capture between the various paths by an integer number of clock intervals and on the other hand, an additional offset effected, for example, by means of a phase shifter.

The process according to the invention will be specified below and better understood through the description which follows of a device which carries out a conversion according to the process described.

BRIEF DESCRIPTION OF THE DRAWINGS

This description will be given with the aid of the appended drawings in which:

FIG. 4 includes FIGS. 4a and 4b.

DETAILED DESCRIPTION

Figure 3:
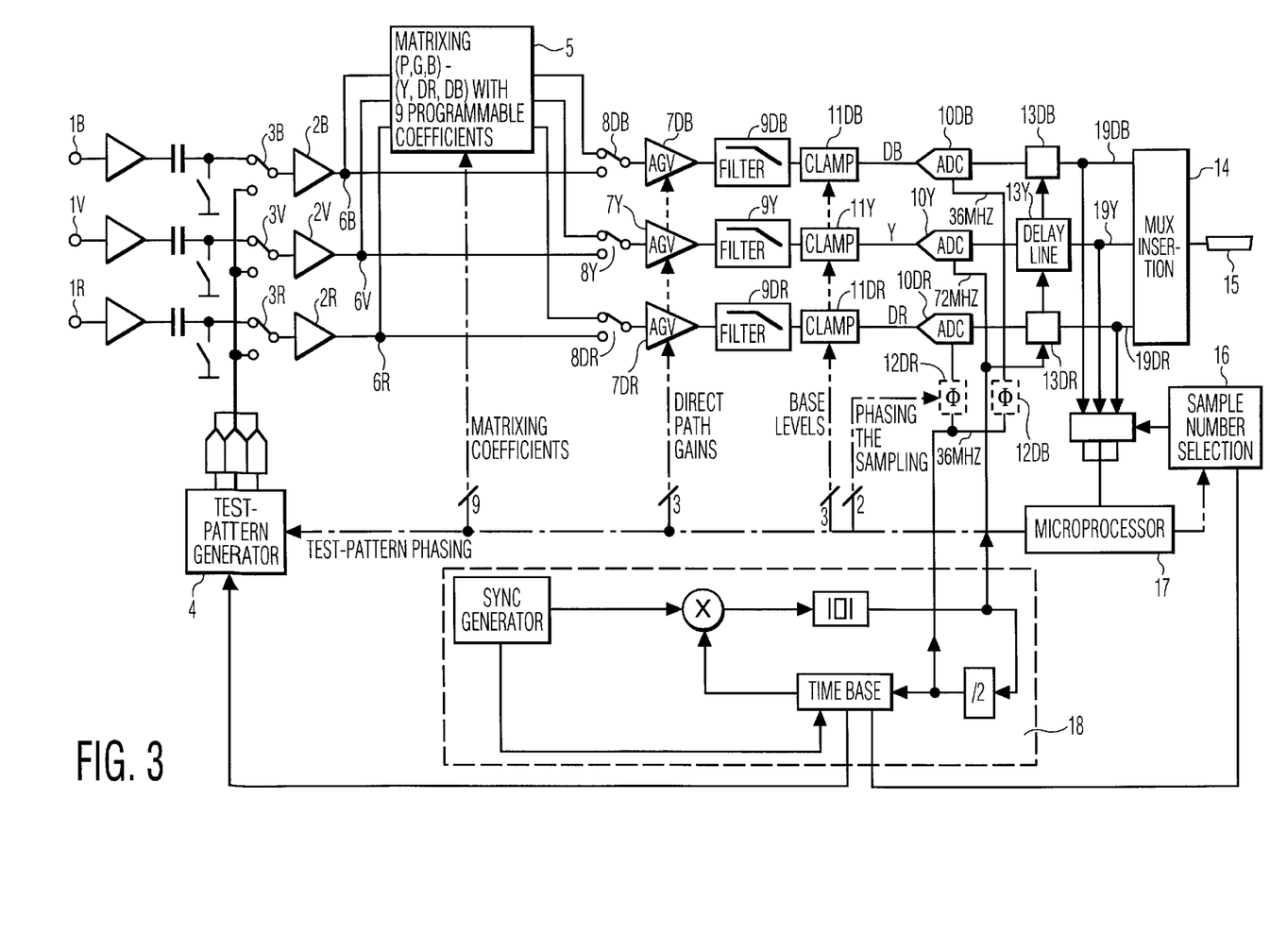
FIG. 3 represents an example of an electrical diagram of an acquisition card operating according to the process of the invention.

FIG. 3 represents an electrical diagram of a card for the acquisition of data representing a standardized colour video signal arriving at the card with analog modulation. The purpose of the acquisition card is to transform this analog modulation into digital modulation according to one of the accepted standards. In the example which will be described and commented upon below, it is assumed that the input is analog with red R, green G, blue B signals, and that the card transforms them into analog signals with a luminance signal Y and two red difference DR and blue difference DB signals before converting them into digital data, for example to the 4.2.2 or HDTV standard.

Naturally, it could also involve an incoming video with Y, DR, DB components and the digital output might be Y, DR, DB.

The card according to this example embodiment includes three inputs 1R, 1G, 1B receiving the red, green and blue analog signals respectively. These signals feed adaptation circuits 2B, 2G, 2R which are in themselves known, via controllable switches 3B, 3G, 3R. These switches are capable of two positions. In a first position, they transmit the signals to be transformed and in a second position they transmit the signals originating from a test-pattern generator 4. This generator can provide analog signals calibrated to the standard of the signals received on the inputs of the adaptation circuits 2. The amplitude of the signals present at the output of the adaptation circuits 2 is converted in a known manner by means of an analog matrix converter 5. This matrix converter receives the analog signals present at the output 6B, 6G and 6R of the adapters 2. The value of each of the nine conversion coefficients is in principal the value adopted according to the transformation standard. According to the invention, the actual value of the multiplier coefficients of the matrix is modified iteratively so that the modified value gives, having regard to the imperfections in the circuits, a value effectively corresponding to the standard.

The value of these coefficients is controllable through a microprocessor 17 whose role will be explained further on.

The output signals from the matrix converter 5 are directed to amplifiers 7DB, 7Y and 7DR by way of switches 8DB, 8Y and 8DR. These switches are capable of two positions. In a first position they receive the signals originating from the matrix converter 5 and in a second position they receive the signals originating from the adapters 2. The first position corresponds to the case in which the conversion circuit converts with change of standard, for example, from red, green, blue (R, G, B), to luminance, red difference, blue difference (Y, DR, DB) as in the case which is the subject of the example presented. The second position corresponds to the case in which the circuit converts without change of colour space, for example from analog DR, Y, DB to digital DR, Y, DB.

The amplifiers 7 have a gain which can be controlled by means of the microprocessor 17. After filtering in filters 9DB, 9Y, 9DR, the signals output by the amplifiers 7 are introduced into analog/digital converters 10DB, 10Y, 10DR by way of devices 11DB, 11Y, 11DR. These devices are intended to adjust the 0 level on the basis of which conversion will be performed. These devices are known as clamp level adjustment devices. The clamp level will hereafter be referred to as the base level. The devices 11 can be adjusted by the microprocessor 17. Stationed just upstream of the converters 10, they therefore make it possible to adjust the offset errors.

In the embodiment represented in FIG. 3, the switches 8 and the variable-gain controllable amplifiers 7 have a physical existence. However, it will be noted that these switches 8 and/or variable-gain amplifiers 7 may be replaced by an action of the coefficients of the programmable matrix converter 5. Thus, if the incoming and outgoing signals are in the colour space Y; DR, DB, the matrix will be a diagonal matrix whose non-zero coefficients are equal to 1. Likewise, the variable character of the gain of the amplifiers 7 can be discarded and replaced by an action on the value of the coefficients of the matrix.

In the example embodiment of FIG. 1, which involves converting an analog video R, G, B into a digital video Y, DR, DB, to the HDTV standard, the sampling frequency on the Y path is double the sampling frequency on the DR and DB paths, i.e. 72 MHz on the Y path and 36 MHz on each of the paths DR and DB.

The instants of sample capture are controlled by a phase-loop controllable clock system 18 which is known per se and generates, on the one hand, control pulses at the frequency 72 MHz so as to control the analog/digital converter 10Y of the luminance path Y and, on the other hand, pulses at the frequency 36 MHz so as to control the converters 10DB and 10DR of the difference paths DB and DR.

[The instants of sample capture of the difference paths DB and DR can be delayed, with respect to the instant of sample capture of the luminance path Y. The delays introduced have been represented by phase-shifters depicted by dashed lines 12DB and 12DR.

The samples output by the path Y are introduced into a delay line 13Y. These two difference paths are introduced into write/read shift registers 13DB and 13DR.

Finally, the outputs from each of the paths are transmitted to an output 15 by way of a multiplexer 14. The role of the write/read shift registers will be explained below. It has been seen that the instants of sample capture take place at different times on each of the paths. For a multiplexer 14 to be able to read in phase the samples present at the output 19DB of the shift register 13B, at the output 19Y of the delay line 13Y and 19DR of the shift register 13DR, it is necessary to offset the instant of reading by the multiplexer 14 by the instant of writing by the ADCs 10. This is the role of the shift registers 13DB and 13DR in combination with the delay line 13Y. This role will be explained in greater detail further below when explaining the operation of the circuit.]

In order automatically to adjust the offset error of the conversion, the conversion coefficients of the matrix converter 5 or those of the variable-gain amplifiers 7, the digital signals present at the output of the delay lines 13 are introduced into the microprocessor 17. The microprocessor 17 controls the switches 13 and the analog test-pattern generator 4 during the blanking periods. By way of a module 16 it also controls the selection of the various samples which it receives.

The microprocessor 17 compares the results obtained with the results which would have been obtained if the conversion had not been tainted with errors. It calculates the necessary corrections.

The operation of the conversion control loop will now be explained in further detail. The adjustments to be performed on the circuit relate to the phasing ΦR and ΦB of the paths DR and DB with respect to the path Y, the redressing of the gain errors (3 for Y, DR, DB input and 9 for R, G, B input) and of the offset errors (3 for Y, DR, DB input and another 3 for R, G, B input).

The gain, offset and phase adjustments are in actual fact weakly interlinked, but are regarded as independent by the software of the microprocessor 17 which alternates the adjustments in sequence.

The error measurements are performed during the blanking times present between the various lines of a frame on the one hand, and between the frames on the other hand.

The microprocessor 17 controls the test pattern 4. The test pattern 4 used allows the generation of eight different levels. The phasing correction is performed in two steps. The phasing is firstly adjusted on the luminance path, the path Y in FIG. 3.

This operation is a necessary preparation for the adjustment of the phases of the two chrominance paths DR and DB. The microprocessor 17 acts on the phase ΦTEST PATTERN of the test pattern in such a way as to obtain a sample of Y exactly in the middle(in terms of amplitude) of the rising edge of the signal Y.

Figure 4A:
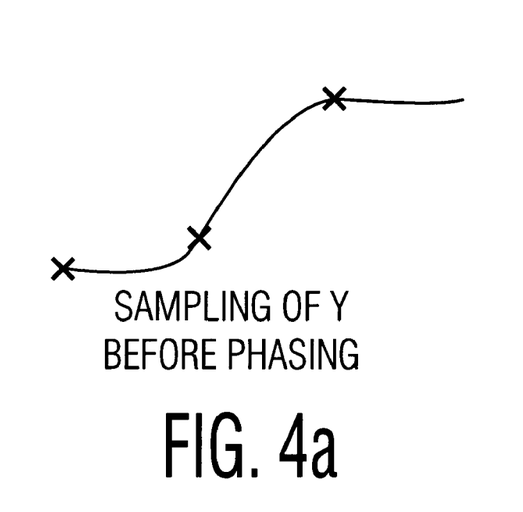
FIG. 4a represents the instants of sample captures during a jump in level without any precaution having been taken.
Figure 4B:
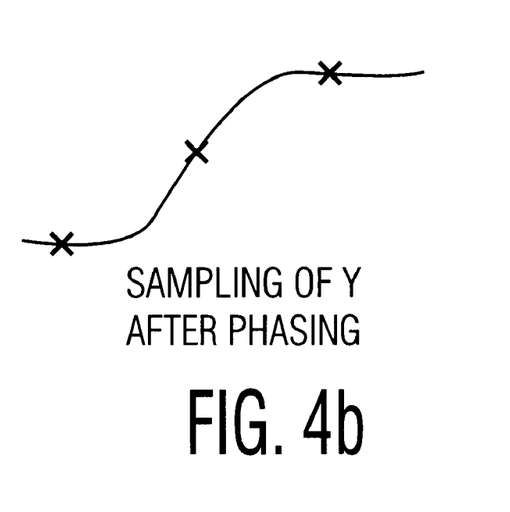
FIG. 4b represents the instants of sample capture during a jump in level, an instant of sample capture corresponding to an instant at which the value of the signal to be converted passes through a predetermined level lying between a preceding level and a succeeding level.

The result to be obtained is represented in FIG. 4. This figure includes FIGS. 4a and 4b. These represent the analog value at the input of the converter circuit 10Y versus time along the abscissa. The crosses represent the sampling instants.

The sampling instants represented in FIG. 4 are instants which lie in an interval of time which includes a change of the level generated by the test pattern. If no precaution is taken, the sampling instants lie anywhere with respect to the instant of change of the level of the test pattern. Thus, in FIG. 4a, a sample is captured almost one sampling period before the rising edge produces any effect. The second sample lies at the beginning of the rising edge and the third at the end of the rising edge. According to the invention, the instant of change of the level of the test pattern will be displaced so that there is a sample capture which coincides with the moment at which the level of the analog value reaches the intermediate value halfway between the two consecutive levels of the test pattern. The level halfway between a preceding level and a succeeding level has been adopted. However, it will be noted that this involves marking an instant in a time marker linked to the analog input signal and it would have been possible to adopt a level representing a specified percentage of the algebraic increment between the preceding level and the succeeding level.

The result of the adjustment of the instant of change of level of the test pattern is represented in FIG. 4b. Compared with FIG. 4a, it may be seen that the instant of the change of level has been advanced so that, after this adjustment, there is a sample captured slightly before the change of level, a sample whose capture coincides with the moment at which the analog value has performed half of the increase between the initial level and the succeeding level.

The phasing of the luminance path Y having been performed, the second step is undertaken, i.e. the phasing of the two chrominance paths DR and DB. A coarse rephasing has already been performed by the digital hardware delay line 13Y, on the basis of the time constants calculated for the paths Y, DR and DB. This delay line enables the phasing of the capturing of samples on this path to be shifted by an integer number of sampling periods. These periods are generated by the time base 18.

After this first redressing, a shift in the capturing of samples on each of the chrominance paths DR and DB of less than one clock period will be sufficient to make the capturing of samples coincide with the moment at which the level of the signal to be converted has reached the mid-level (or the predetermined level) between the initial level and the final level.

This shift of less than one period is controlled by the microprocessor 17. After adjusting the phase shift, one and the same sample number x corresponds on the three paths to the mid-level between two intermediate levels.

Figure 5A:
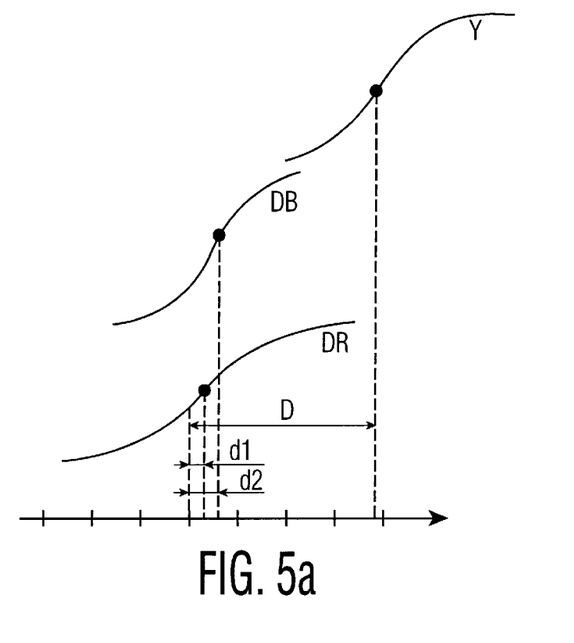
FIG. 5 illustrates the time offset required between the sampling of two signals originally in phase but having undergone different processing delays. It includes FIGS. 5a and 5b.

The result obtained is represented in FIG. 5.

This figure represents on the left the instants of sample capture at the level of the ADCs 10 on each of the paths Y, DB, DR. The time axis, along the abscissa, is graduated in sampling periods.

[In the dummy example represented, the path Y is slightly more than 3 sampling periods in advance. The delay line 13Y will delay the sample by 4 sampling periods. The samples DB, DR output by the converters 10DB and 10DR are after this delay of the path Y less than one period in advance of the path Y. In order to set the sample captures back into phase, the microprocessor 17 will delay the sample capture by d1 on the path DB and by d2 on the path DR. d1 and d2 represent the advance of the sample capture on the paths DB and DR with respect to the instant located 4 periods before the sample capture on the path Y.

The sample output by the converter 10Y is introduced into the delay line 13Y where it is delayed by 4 periods. The samples output by the converters 10DB and 10DR are introduced into the write/read shift registers 13DB and 13DR where they are shifted by a duration d1 and d2 respectively.

Hence, at the moment of the reading of the delay line and of the registers by the multiplexer 14, the samples are again in phase.

Figure 5B:
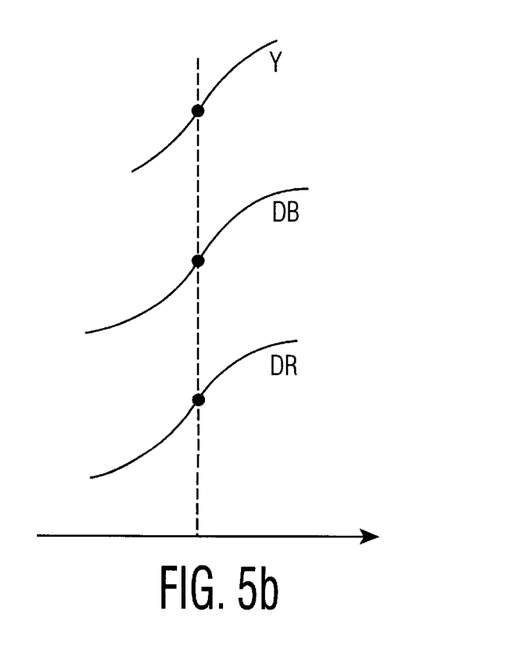

The result is represented in FIG. 5b wherein are seen the 3 samples in phase on each of the paths. Thus, the different delays introduced by each of the paths have been compensated for, on the one hand, by a delay introduced into the fastest path by the digital delay line 13Y and, on the other hand, by a shifting of the sample capture on the other paths. In the example represented, only one path is equipped with a digital delay line. It would be permissible also to equip another path if necessary, only the slowest path not being equipped. It is also understood that the same result could be obtained through analog delay lines stationed upstream of the converters 10.]

The time shifts with regard to the capturing of samples correct the differences in delay of each of the paths so that after correction the digital signals on each of the paths correspond to one and the same initial instant of the analog signal. Monitoring has been carried out to ensure that the delay on each of the paths is independent of the level of the signal to be converted so that the correction performed at one level is valid for the whole dynamic range of the signal.

After adjusting the phasing, the gain line of each converter is adjusted as described below:

When the analog/digital conversion is performed from an analog colour space to a digital colour space with the same definition, for example from a Y, DR, DB analog colour space to a Y, DR, DB digital colour space, the microprocessor 17 controls the level gain corrections of the adjustable gain amplifiers 7.

It also corrects the offset errors by way of the base level adjustment devices 11.

When the conversion is performed from an analog colour space to some other digital colour space, for example from an R, G, B analog colour space to a Y, DR, DB digital colour space, the microprocessor corrects the nine coefficients of the conversion matrix of the matrix converter 5 and the offsets on each of the paths by way of the base level adjustment devices 11.

In both cases, the principle of correction is the same, but in the second case (that of change of colour space), three consecutive adjustments are undertaken. A first adjustment, while the test signal from the test pattern 4 is sent to the input R only, makes it possible to adjust the value of the conversion matrix coefficients applied to the red value. The second adjustment is performed while the signal from the test pattern 4 is sent to the input 1G alone. It allows adjustment of the conversion matrix conversion coefficients applied to the green value. The third adjustment is performed while the signal from the test pattern 4 is sent to the input 1B alone. It allows adjustment of the conversion matrix coefficients applied to the blue value.

Figure 6:
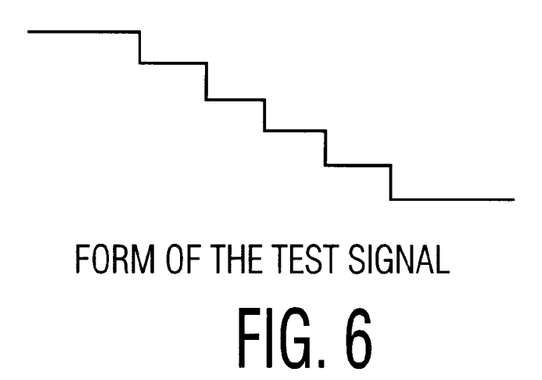
FIG. 6 represents the form of a predetermined signal intended to monitor the quality of the conversion.

To perform an adjustment on each of the three paths, the test-pattern generator 4 controlled by the microprocessor 17 delivers a staircase signal, as represented in FIG. 6, on one of the paths. In order to obtain a fine correction value for each plateau, the test-pattern generator 4 generates values which vary about this plateau. The values about the plateau are chosen symmetrically about the level of the plateau. The maximum amplitude of the variation about the value of the plateau represents several quantization spacings. In the example described here, thirty-two measurements are undertaken for each plateau, the maximum value of discrepancy with respect to the level of the plateau being four quantization spacings. The thirty-two different values converted about this plateau are received by the microprocessor 17 which then calculates a mean value. This mean value is stored in memory.

Figure 7:
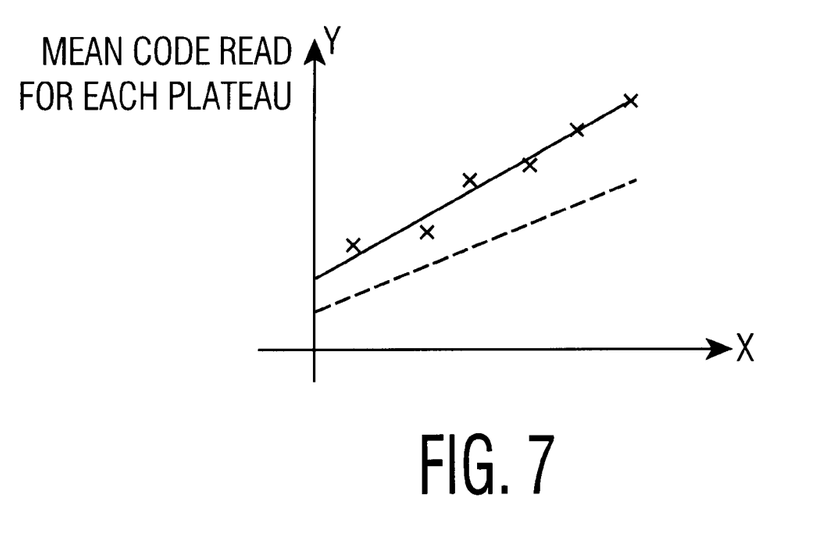
FIG. 7 is a graph representing on the one hand the theoretical conversion line, shown dashed, and on the other hand the actual conversion line, shown unbroken, obtained by calculation from actual conversion points.

When each of the plateaux has formed the subject of measurements, the microprocessor 17 has a set of mean values. A graphical representation of these values is shown in FIG. 7. This figure is a graph. The input values X delivered by the test pattern are plotted along the abscissa. Plotted along the ordinate are the values Y actually obtained by averaging for each plateau the thirty-two values captured symmetrically about the value defined by the plateau. The theoretical conversion straight line, which would be obtained with an ideal conversion, is represented with dashes. The points obtained for each of the plateaux are represented by crosses.

The microprocessor 17 is programmed to calculate from the points portrayed by crosses the best straight line with equation $$Y = a_1 X + b_1$$

passing through, or between, these points. This straight line is obtained by virtue of a so-called least squares algorithm. The effect of this algorithm is to calculate the coefficients a1 and b1 so as to minimize the sum of the squares of the distances from each of the points represented by a cross to the straight line with equation $$Y = a_1 X + b_1$$

The details of this calculation are known to those skilled in the art. The theoretical straight line with equation $$Y = a_0 X + b_0$$

is known and results from each of the standards defining a transmission norm. In the example explained here, the HDTV standard gives the correspondence between the output codes and the input voltages. The latter given by the test pattern 4 are known. The microprocessor 17 then acts on the gain of each of the paths so as to make $a_1$ tend to $a_0$ and on the offset of the path so as to make $b_1$ tend to $b_0$.

It should be noted that the adapting of a set of coefficients to a different standard (ex Japanese standard) requires merely a different parameter setting of the software rather than a modification of the hardware.

When the circuit converts from an analog colour space to the same digital colour space, for example Y, DR, DB to Y, DR, DB, the gain is adjusted by way of the variable-gain amplifiers 7. When the circuit converts from an analog colour space to a different digital colour space, for example from R, G, B to Y, DR, DB, the gain is adjusted by acting on the three coefficients, red, then blue and finally green, of the conversion matrix. In both cases, the offsets are adjusted by acting on the base level adjustment devices 11.

Thus, if $A_2$, $B_2$, $C_2$ represent the components of the converted video signal, $A_1$, $B_1$, $C_1$ the components of the input video signal and M the conversion matrix, we have the following relation:

$$\begin{pmatrix} A_2 \\ B_2 \\ C_2 \end{pmatrix} = M \begin{pmatrix} A_r \\ B_1 \\ C_1 \end{pmatrix}$$

with $M = \begin{pmatrix} a_1 & a_2 & a_3 \\ b_1 & b_2 & b_3 \\ c_1 & c_2 & c_3 \end{pmatrix}$ $a_1, a_2, a_3; b_1, b_2, b_3; c_1, c_2, c_3$ are the conversion or change of norm coefficients. If $A_2$, $B_2$, $C_2$ correspond, for example, to DR, Y, DB and $A_1$, $B_1$, $C_1$ to R, G, B, red generation only will allow the adjustment of the coefficients $a_1$, $b_1$, $c_1$, blue generation that of a2, b2, c2 and green generation that of $a_3$, $b_3$, $c_3$.

In the example represented, the gain adjustments are performed continually by virtue of adjustments performed during the blanking times between the frames. The adjustment of the black reference is performed continually by virtue of measurements performed during the blanking times between the lines by acting on the devices 11.

What is claimed is:

1. Process for correcting the value of an input quantity X of an analog/digital converter delivering a digital output quantity Y dependent on the value of the quantity X, the output value Y exhibiting n values $Y_0, \ldots, Y_{n-1}$ regularly spaced by a spacing $\Delta Y$ when X varies from a value $X^0$ to a value $X_{n-1}$, Y exhibiting the value $Y_0$ when X has, to within a spacing, the value $X_0$, the value $Y_{n-1}$ when X has, to within a spacing, the value $X_{n-1}$ and n-2 intermediate values $Y_1, Y_2, \ldots, Y_{n-2}$ resulting from the quantity X, on the one hand through a linear transformation of the form $Y=a_0X+b_0$, and on the other hand, through a quantization Y, Y retaining the same output value $Y_p$ when X varies from a value $X_{p-1}$ to a value $X_p$, the value $Y_p$ being one of the values obtained from the linear transformation when X varies between $X_{p-1}$ and $X_p$, in which process corrections are performed during conversion suspension periods interposed between periods of conversion, so as to inject known values of the input quantity X into the converter and calculate therefrom correction values to be applied, the process being characterized in that during one or more conversion suspension periods and in a continual iterative manner throughout conversion, a) measuring output values $Y_{m1}, \ldots Y_{mn}$ for an integer number m of input values $X_{m1}, \ldots, X_{mm}$;

b) calculating the actual conversion line from the resulting m measurements using the equation $Y=a_1X+b_1$, this line being the nearest to the m points with co-ordinates $X_{m1}, Y_{m1}; X_{m2}, Y_{m2}; \ldots; X_{mm}, Y_{mm}$, c) correcting the offset error by adding the algebraic value of the difference b between $b_1$ and $b_0$ to the analog input quantity, d) correcting the gain of conversion by multiplying the input quantity X by the latest calculated ratio $a_1/a_0$.

2. Process according to claim 1, characterized in that to obtain each of the m output values $Y_m$, corresponding to an input value $X_m$, a central value $X_{m0}$ is defined and the input quantity X is made to vary by allocating it s input values $X_{r1}, \ldots, X_{rs}$ exhibiting a symmetry with respect to the central value $X_{m0}$, the output value $Y_m$ being the mean $Y_m$ obtained by averaging the values $Y_{r1}, \ldots, Y_{rs}$ corresponding to the output values of the quantity Y when the quantity X takes the values $X_{r1}, \ldots, X_{rs}$, respectively.

3. Process according to claim 2, characterized in that the discrepancy between a minimum value $X_{rmin}$ and a maximum value $X_{rmax}$ of each of the s input values $X_r$ participating in the obtaining of a mean output value $\overline{Y}_m$ is several spacings, each spacing being of value $$\frac{X_{n-1} - X_0}{n}.$$

4. Process according to claim 3, characterized in that the discrepancy between the minimum input value $X_{rmin}$ and the maximum input value $X_{rmax}$ of the set of s input values participating in the obtaining of a mean output value $\overline{Y}_r$ lies between 4 and 12 spacings of value $$\frac{X_{n-1} - X_0}{n}.$$

5. Process for correcting the conversion of analog components $A_1$, $B_1$, $C_1$ of a television video signal which are expressed according to a color space, into digital components $A_2$, $B_2$, $C_2$ expressed according to the same color space or according to a different color space, the color space of each of the output components $A_2$, $B_2$, $C_2$ resulting from a linear combination performed on the input quantities of the form $$\begin{pmatrix} A_2 \\ B_2 \\ C_2 \end{pmatrix} = (M) \begin{pmatrix} A_1 \\ B_1 \\ C_1 \end{pmatrix}$$

where M is a conversion matrix of the form $$M = \begin{pmatrix} a_1 & a_2 & a_3 \\ b_1 & b_2 & b_3 \\ c_1 & c_2 & c_3 \end{pmatrix}$$

in which $a_1, a_2, a_3; b_1, b_2, b_3; c_1, C_2, C_3$ are the conversion coefficients, in which process the conversion of each output component is performed on a path for converting this component by means of an analog converter delivering an output quantity Y dependent on the value of an input quantity X, the output value Y exhibiting n values $Y^0, \ldots, Y_{n-1}$ regularly spaced by a spacing $\Delta Y$ when X varies from a value $X_0$ to a value $X_{n-1}$, Y exhibiting the value $Y_0$ when X has, to within a spacing, the value $X_0$, $Y_{n-1}$ when X has, to within a spacing, the value $X_{n-1}$ and n-2 intermediate values $Y_1, Y_3, \ldots, Y_{n-2}$ resulting from the quantity X, on the one hand through a linear transformation of the form $Y = a_0 X + b_0$, and on the other hand, through a quantization of Y, Y retaining the same output value $Y_p$, when X varies from a value $X_{p-1}$ to a value $X_p$, the value $Y_p$ being one of the values obtained from the linear transformation when X takes one of the values lying between $X_{p-1}$ and $X_p$, the input quantity X being in this case on each of the conversion paths $A_2$, $B_2$, $C_2$, the linear combination of the components $A_1$, $B_1$, $C_1$ participating in the formation of this path, in which process the corrections are performed during conversion suspension periods interposed between periods of conversion, so as to inject known values of the input quantity X into the converter and calculate correction values to be applied, the process being characterized in that during one or more suspension periods, a) for an integer number m of known input values $X_{m1}, \ldots, X_{mm}$, the output values $Y_{m1}, Y_2, \ldots, Y_{mm}$ obtained are measured on each path, b) the equation $Y = a_1 X + b_1$ of the actual conversion line resulting from these m measurements is calculated on each path, this line being the nearest to the m points with co-ordinates $X_{m1}, Y_{m1}; X_{m2}, Ym_2; \ldots; X_{mm}, Y_{mm}$, c) the offset error is corrected on each of the paths by adding the algebraic value of the difference between $b_1$ and $b_0$ to the analog input quantity, d) the gain of the conversion on a path is corrected by multiplying each of the color space coefficients participating in the composition of this path by the latest ratio $a_1/a_0$ calculated, a) measuring for each path, output values $Y_{m1}, Y_{m2}, Y_{mn}$ for an integer number m of known input values $X_{m1}, \ldots, X_{mm}$;

b) calculating for each path, the actual conversion line from the resulting m measurements using the equation $Y = a_1 X + b_1$, this line being the nearest to the m points with co-ordinates $X_{m1}, Y_{m1}; X_{m2}, Y_{m2}; \ldots; X_{mm}, Y_{mm}$, c) correcting the offset error for each path, by adding the algebraic value of the difference between $b_1$ and $b_0$ to the analog input quantity, d) correcting the gain of conversion on a path by multiplying each of the color space coefficients participating in the composition of this path by the latest ratio $a_1/a_0$ calculated.

6. Process according to claim 5, characterized in that to obtain each of the m output values $Y_m$, corresponding to an input value $X_m$, a central value $X_{m0}$ is defined and the input quantity X is made to vary by allocating it s input values $X_{r1}, \ldots, X_{rs}$ exhibiting a symmetry with respect to the central value $X_{m0}$, the output value $Y_m$ being the mean $\overline{Y}_m$ obtained by averaging the values $Y_{r1}, \ldots, Y_{rs}$ corresponding to the output values of the quantity Y when the quantity X takes the values $X_{r1}, \ldots, X_{rs}$ respectively.

7. Process according to claim 5, characterized in that the differences in propagation time of the video signal between the various conversion paths are corrected by introducing onto one path at least one delay intended to delay the output of the digital samples on this path.

8. Process according to claim 7, characterized in that an offset is furthermore introduced between the instants of capturing samples on a path and the instants of capturing samples on at least one other path.

9. Process according to claim 8, characterized in that the setting of the instant of capturing a sample, upon a known jump in level, this jump having the effect of displacing the conversion value from a preceding initial value to a succeeding final value, coincides with an instant at which the value of the converted signal corresponds to the preceding level increased by a predetermined percentage of the algebraic difference between the succeeding level and the preceding level, this predetermined percentage being the same on each of the paths.

10. Device for converting analog components $A_1$, $B_1$, $C_1$ of a television video signal expressed according to an input colour space, into digital components $A_2$, $B_2$, $C_2$ expressed according to the same colour space as that of the input or according to a different colour space, the device including inputs (1B, 1G, 1R) each receiving an input component, these inputs feeding a matrix converter (5) effecting a linear combination of the input components, and feeding a conversion path, each conversion path including an analog/digital converter (10DB, 10Y, 10DR) delivering on an output (19Y, 19DB, 19DR) a digital output component of the converted video signal, a device characterized in that it includes means for correcting and adjusting the conversion, these means including a microprocessor 17, this microprocessor controlling the value of the coefficients of the matrix converter (5), controllable devices for adjusting the base levels (11DB, 11DR, 11Y) stationed upstream of each of the analog/digital converters, a test-pattern generator (4), this generator controlling input switches (3B, 3G, 3R) capable of two positions, a first and a second, in the first position the input switches are connected to the inputs (1B, 1G, 1R) of the conversion device, in the second position they are connected to outputs of the test-pattern generator (4), the microprocessor (17) receiving, during conversion suspension periods, signals originating from the test-pattern generator (4) and converted by the analog/digital converters (10), and calculating the corrections to be applied to the conversion coefficients of the matrix converter (5) and those to be applied to the device for adjusting the base levels (11).

11. Device according to claim 10, characterized in that the microprocessor (17) controls the instants of change of levels generated by the test pattern so as to pass from a preceding level to a succeeding level in such a way that an instant of capturing samples by the analog/digital converter of one path coincides with the instant at which the analog signal passes through an intermediate value representing an algebraic increment of the preceding level, this increment having as value a predetermined percentage of the difference between the succeeding level and the preceding level, and in that the microprocessor (17) furthermore controls an offset in the instant of the capturing of digital samples on the other conversion paths.

12. Conversion device according to claim 10, characterized in that one of the paths includes a controllable digital delay line (13Y) downstream of the analog digital converter (10Y) of this path.

13. Conversion device according to claim 10, characterized in that one at least of the paths includes an analog delay line upstream of the analog digital converter (10Y) of this path.

14. Conversion device according to claim 11, characterized in that it includes on one path at least downstream of the analog digital converters (10Y, 10DB, 10DR) a write/read shift register (13DB and 13DR).

15. Conversion device according to claim 10, characterized in that it includes on a first path, downstream of the analog digital converter (10Y) of this path, a digital delay line (13Y), and at least on a second path downstream of the analog digital converter of this path (13DB) a write/read shift register (13DB, 13DR).

16. The process set forth in claim 5, characterized in that outputs of the paths feeds a multiplexer which provides a muliplexed output.

17. Process according to claim 6, characterized in that the differences in propagation time of the video signal between the various conversion paths are corrected by introducing onto one path at least one delay intended to delay the output of the digital samples on this path.

18. Conversion device according to claim 12, characterized in that it includes on one path at least downstream of the analog digital converters (10Y, 10DB, 10DR) a write/read shift register (13DB and 13DR).

19. The process set forth in claim 2, characterized in that an output of the path feeds a multiplexer which provides a muliplexed output.

* * * * *